US012692602B2

(12) United States Patent　　　　　(10) Patent No.:　US 12,692,602 B2
Kollberg et al.　　　　　　　　　　　(45) Date of Patent:　　　Jul. 28, 2026

(54) WALL-COOLED GAS-INLET ELEMENT FOR A CVD REACTOR

(71) Applicant: AIXTRON SE, Herzogenrath (DE)

(72) Inventors: Marcel Kollberg, Würselen (DE); Benjamin David Wright, Cambridge (GB); Merim Mukinovic, Würselen (DE); Barry O'Neil, Herzogenrath (DE); Marc Plummer, Cambridgeshire (GB)

(73) Assignee: AIXTRON SE, Herzogenrath (DE)

( * ) Notice: Subject to any disclaimer, the term of this patent is extended or adjusted under 35 U.S.C. 154(b) by 691 days.

(21) Appl. No.: 17/779,049

(22) PCT Filed: Nov. 17, 2020

(86) PCT No.: PCT/EP2020/082349
§ 371 (c)(1),
(2) Date: May 23, 2022

(87) PCT Pub. No.: WO2021/104932
PCT Pub. Date: Jun. 3, 2021

(65) Prior Publication Data
US 2022/0396877 A1　　Dec. 15, 2022

(30) Foreign Application Priority Data

Nov. 25, 2019　(DE) ..................... 10 2019 131 794.0

(51) Int. Cl.
*C23C 16/455*　　　(2006.01)
(52) U.S. Cl.
CPC .. *C23C 16/45572* (2013.01); *C23C 16/45508* (2013.01); *C23C 16/45576* (2013.01); *C23C 16/4558* (2013.01)

(58) Field of Classification Search
None
See application file for complete search history.

(56) References Cited

U.S. PATENT DOCUMENTS 8,821,641 B2　9/2014　Lee et al.
2011/0294283 A1*　12/2011　Brien ................ C23C 16/45508
118/725

(Continued)

FOREIGN PATENT DOCUMENTS

DE　　10 2008 055 582 A1　　6/2010
DE　　　10 043 600 B4　　12/2013

(Continued)

OTHER PUBLICATIONS

Written Opinion mailed Feb. 22, 2021, from the ISA/European Patent Office, for International Patent Application No. PCT/EP2020/082349 (filed Nov. 17, 2020), English translation, 11 pgs.

(Continued)

*Primary Examiner* — Jeffrie R Lund
*Assistant Examiner* — Tiffany Z Nuckols
(74) *Attorney, Agent, or Firm* — Ascenda Law Group, PC

(57) ABSTRACT

A gas inlet element for a CVD reactor includes a cylindrical main body, which together with an outer wall, forms a gas outlet face. The outer wall surrounds at least one gas distribution chamber. A plurality of gas outlet openings originating in the gas distribution chamber open out into the gas outlet face. A cooling device includes a plurality of cooling channels running adjacently but separately in the outer wall, and the gas outlet openings extend between cooling channels.

17 Claims, 6 Drawing Sheets

(56)         References Cited

U.S. PATENT DOCUMENTS

| | | | |
|---|---|---|---|
| 2012/0100292 A1* | 4/2012 | Park | C23C 16/4584 |
| | | | 118/725 |
| 2013/0084391 A1* | 4/2013 | Lee | H01L 21/68764 |
| | | | 239/290 |
| 2013/0299009 A1* | 11/2013 | Jiang | C23C 16/45572 |
| | | | 137/15.01 |
| 2015/0118416 A1 | 4/2015 | Jang et al. | |
| 2016/0225619 A1* | 8/2016 | Ruda Y Witt | C23C 16/458 |
| 2018/0163305 A1 | 6/2018 | Batzer et al. | |
| 2019/0226082 A1* | 7/2019 | Kollberg | C23C 16/4405 |
| 2022/0033965 A1* | 2/2022 | Kollberg | B23K 26/389 |
| 2024/0102164 A1* | 3/2024 | Bee | C23C 16/4584 |

FOREIGN PATENT DOCUMENTS

| | | |
|---|---|---|
| DE | 10 2015 101 462 A1 | 2/2015 |
| DE | 10 2018 130 140 A1 | 5/2020 |
| EP | 2 560 193 A1 | 2/2013 |
| EP | 2 975 157 A1 | 1/2016 |
| KR | 20110116470 A | 10/2011 |

OTHER PUBLICATIONS

International Preliminary Report on Patentability issued May 17, 2022, from The International Bureau of WIPO, for International Patent Application No. PCT/EP2020/082349 (filed Nov. 17, 2020), 24 pgs.

International Search Report mailed Feb. 22, 2021, from the ISA/European Patent Office, for International Patent Application No. PCT/EP2020/082349 (filed Nov. 17, 2020), 9 pgs.

Written Opinion mailed Feb. 22, 2021, from the ISA/European Patent Office, for International Patent Application No. PCT/EP2020/082349 (filed Nov. 17, 2020), 11 pgs.

* cited by examiner

_Fig·1_

_Fig.2_
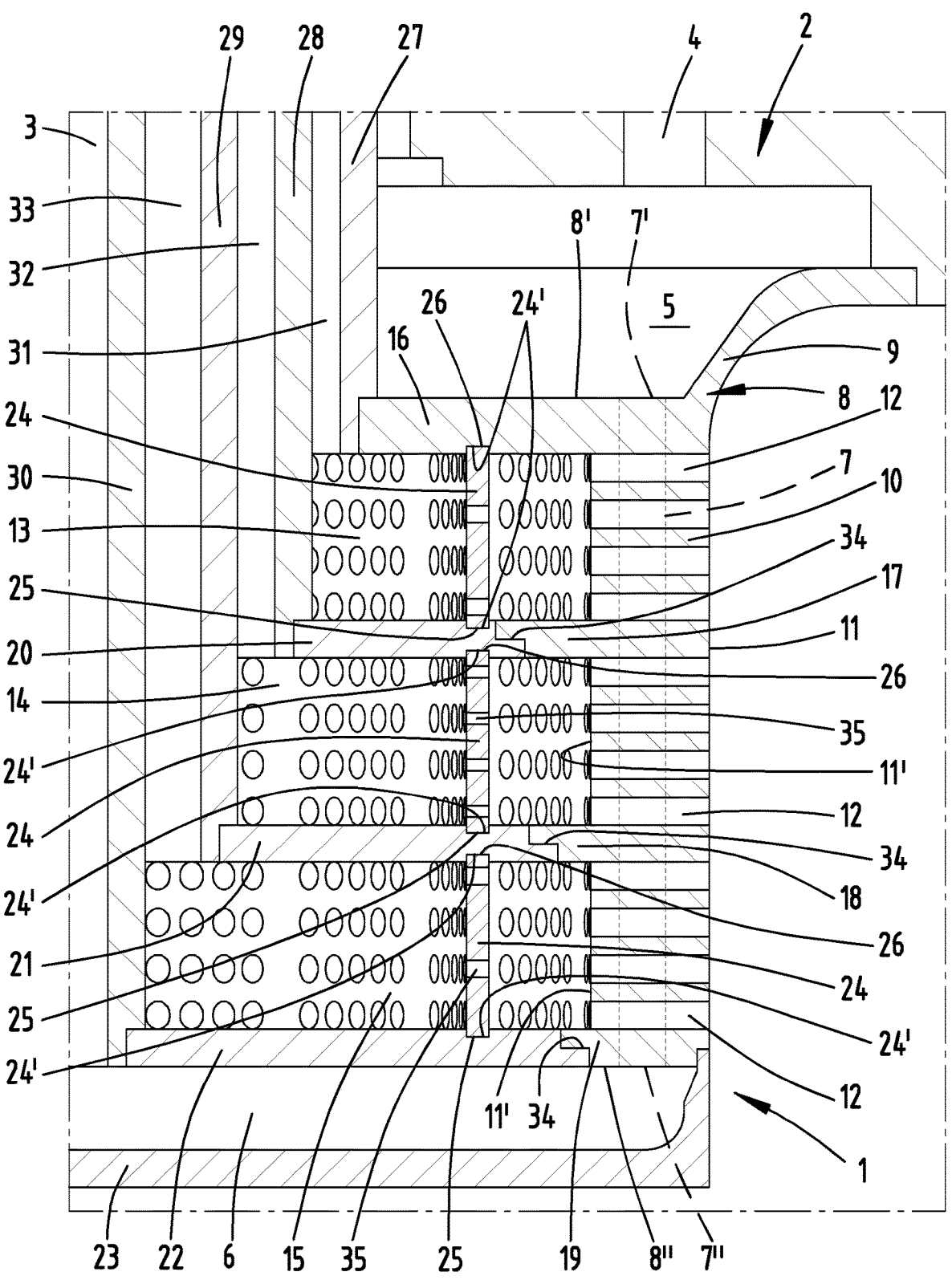

Fig·8
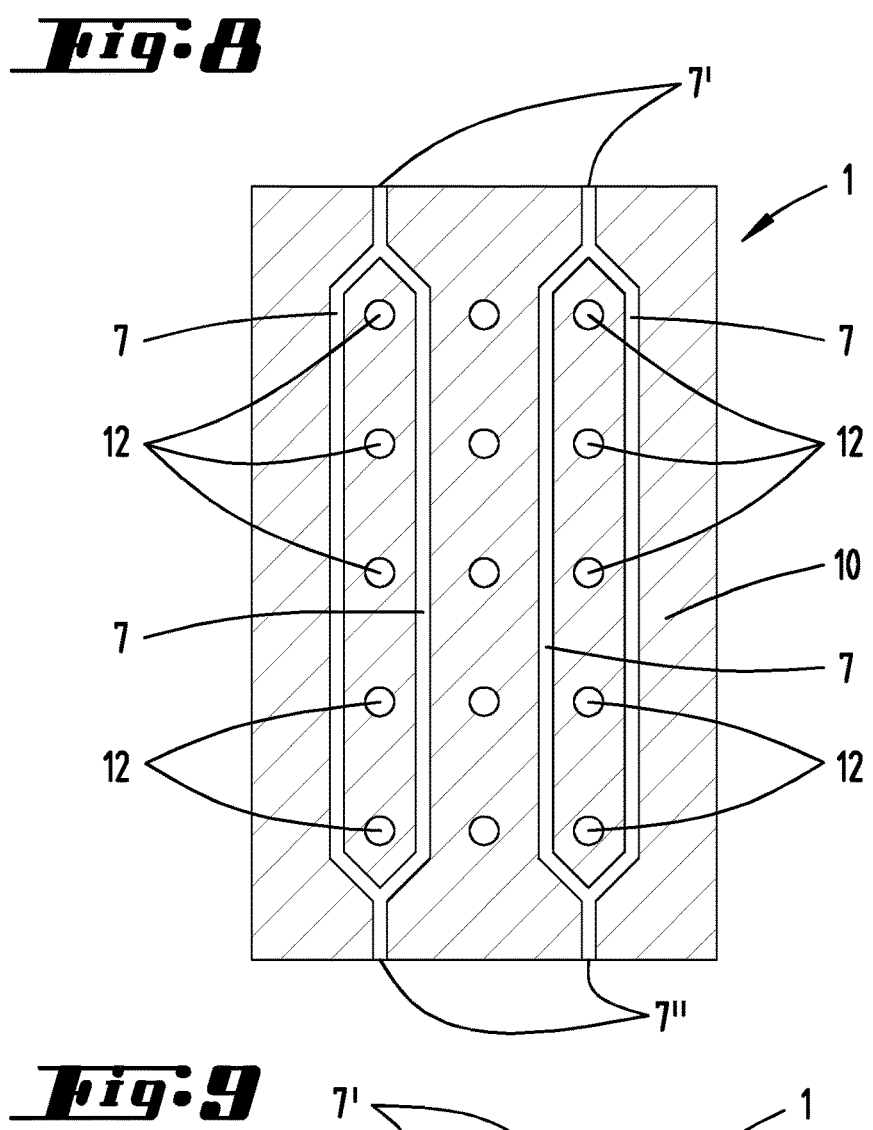
Fig·9
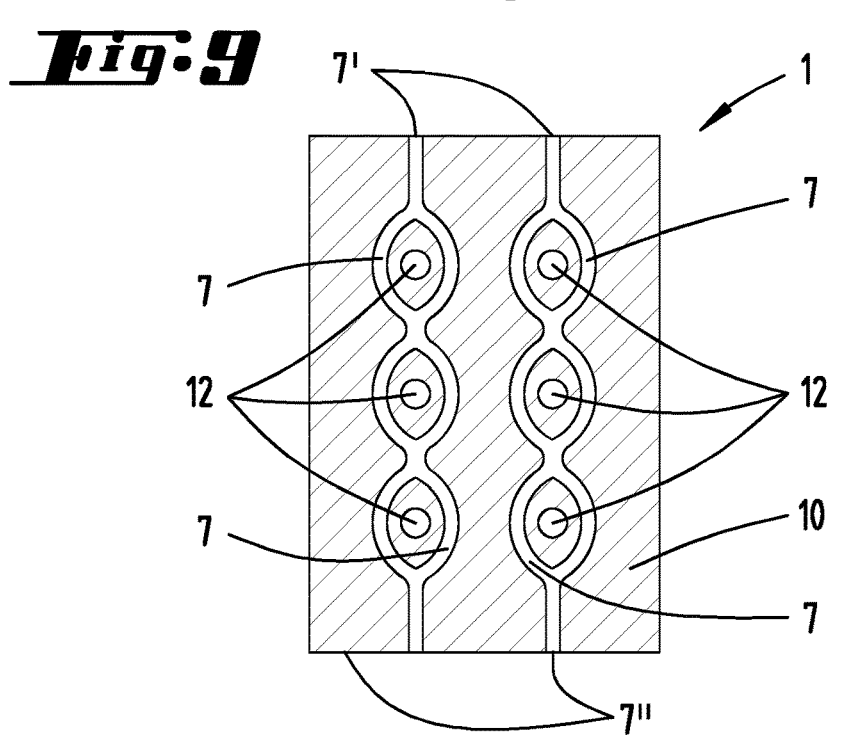

WALL-COOLED GAS-INLET ELEMENT FOR A CVD REACTOR

RELATED APPLICATIONS

This application is a National Stage under 35 USC 371 of and claims priority to International Application No. PCT/EP2020/082349, filed 11 Nov. 2020, which claims the priority benefit of DE Application No. 10 2019 131 794.0, filed 25 Nov. 2019.

FIELD OF THE INVENTION

The invention relates to a gas inlet unit for a CVD reactor, with a cylindrical base body which, with an outer wall, which surrounds at least one gas distribution chamber, forms a gas outlet surface, into which open a multiplicity of gas outlet openings originating in the gas distribution chamber, with at least one gas supply line, through which a gas can be fed into the gas distribution chamber, and with a cooling device, which is associated with the outer wall, and is connected in terms of flow to a coolant supply line and a coolant discharge line, in order to convey a coolant through the cooling device.

The invention further relates to a gas inlet device, which has a holder to which the gas inlet unit is attached. The invention further relates to a CVD reactor with such a gas inlet unit.

BACKGROUND

Gas inlet units with a cooling device, with which an outer wall of a cylindrical base body can be cooled, are described in U.S. Pat. No. 8,821,641 B1 and in EP 2 560 193 A1. The gas inlet units there described have a central pipe, into which process gases are fed. The central pipe is connected to the outer wall of the base body by way of radially running smaller pipes. The smaller pipes cross a cooling volume extending between two pipes, through which a cooling liquid can flow.

DE 10 2008 055 582 A1 describes a gas inlet unit with a cylindrical base body produced from quartz. Three gas distribution chambers lie one above another in the axial direction, and are fed with process gas by way of central supply lines. A coolant can flow through an innermost supply line, into a coolant chamber arranged on the floor of the gas inlet unit.

DE 10 2018 130 140 A1 describes a method with which linear and non-linear channels in a gas inlet unit consisting of quartz can be produced.

US 2018/0163305 A1 describes a CVD reactor with a flat cylindrical gas inlet unit. The gas inlet unit has the function of a showerhead. Diametrically opposite coolant chambers are located in the edge region of the gas inlet unit, into each of which coolant chambers coolant lines open, such that a coolant can be fed into a coolant chamber. The two coolant chambers are connected to one another by a number of cooling channels arranged separately side-by-side, such that the coolant can flow into the other coolant chamber, and can flow out of the latter through the other coolant line.

SUMMARY OF THE INVENTION

The invention is based on the object of developing a generic gas inlet unit in a manner that is advantageous in use, and, in particular, to provide measures with which the gas outlet surface can be cooled in a manner that is more beneficial in terms of process technology.

The object is achieved by the invention specified in the claims, wherein the dependent claims represent not only advantageous developments of the independent claim, but also independent solutions of the object.

First and foremost, it is proposed that the cooling device is designed in the form of a multiplicity of cooling channels running side-by-side. The cooling channels preferably run within an outer wall of a base body of the gas inlet unit, which outer wall consists of metal, in particular stainless steel, a ceramic, or quartz. Bores extend through the outer wall between the cooling channels, which bores form the gas outlet openings. The cooling channels thus extend in the same solid body in which the gas outlet openings also extend. The cooling channels, through which a liquid cooling medium flows when the device is in use, are preferably not connected to one another. They can run, without branches, or with the formation of branches, with uninterrupted walls, from a coolant distribution chamber to a coolant collection chamber, wherein the coolant distribution chamber distributes the coolant to the, preferably at least ten, cooling channels, and the coolant collection chamber collects the coolant flowing through the cooling channels. The cooling channels, which preferably have the same cross-section over their entire respective lengths, or at least in some regions, can branch apart such that one or a plurality of gas outlet openings are located between two branches, wherein provision can be made for branching cooling channels to run around one or a plurality of gas outlet openings. The base body preferably has a cylindrical shape, and forms an outer wall extending along an outer surface of a cylinder. The cooling channels extend essentially in the axial direction of this cylinder, wherein the cooling channels can run parallel to the axis. However, the cooling channels can also run obliquely to the axis, or on curved, in particular serpentine, lines. The two openings of the cooling channels facing away from one another are preferably located in the end surfaces of the cylinder. The openings of the cooling channels communicate with two coolant chambers that are separated from one another. The coolant is fed into one of the coolant chambers, and distributed to the cooling channels, which are preferably of the same design as one another. The coolant chamber forms the coolant distribution chamber. Another coolant chamber forms a coolant collection chamber, which communicates with the coolant discharge line. The approx. 2 to 10 mm thick outer wall of the gas inlet unit preferably consists of stainless steel, a ceramic, or quartz. In this outer wall, the cooling channels extend in the form of linear, curved and, in particular, serpentine, tunnels. Within the otherwise solid outer wall, the preferably linear gas outlet openings run transversely to the route of the cooling channels. The cooling channels preferably have uninterrupted walls. The cooling channels can have a constant cross-section over their entire respective lengths. The cooling channels can have the same cross-sectional area. The cross-sectional area can be a circular area, an oval, or also a polygonal area. The cooling channels preferably have no branches or similar, or are branched such that tunnel-shaped channels run around individual gas outlet openings. The base body can have flat end surfaces on both of its end faces, at least in some regions. The end surfaces facing away from one another can run parallel to one another. The openings of the cooling channels can be arranged in these end surfaces. However, the end surfaces can also be sections of the inner wall of a respective coolant chamber. In this respect, the coolant chambers are preferably in each case associated with an end surface. A first coolant chamber can form an annular volume. Supply lines for the coolant or the gases extend through the annular opening of the annular volume, and are brought into a process chamber of a CVD reactor by the gas inlet unit. A coolant chamber arranged on a floor of the gas inlet unit can extend over the entire floor surface. A first coolant chamber can be separated from at least one gas distribution chamber by an annular plate. A second coolant chamber can be separated from the at least one gas distribution chamber with a separator plate. The coolant line, for example a supply line or a discharge line, can be a pipe that runs coaxially with the axis of the cylindrical body. Through this pipe, the coolant, which preferably takes the form of a cooling liquid, can be fed into a coolant chamber. This coolant chamber is a coolant distribution chamber, and distributes the coolant to the plurality of cooling channels, which extend in the outer wall so as to cool the outer wall. The annular coolant chamber can be a coolant collection chamber, which is connected to a coolant discharge line. However, the coolant flow can also flow in the opposite direction through the coolant chambers and the cooling channels. A coolant chamber, arranged at the free end of the gas inlet unit, can be closed by a cap-shaped closure element, consisting of metal, in particular stainless steel, a ceramic, or quartz. The closure element forms a central section, which runs parallel to a separator plate, with which the coolant chamber is separated from an adjacent gas distribution chamber. In a preferred configuration, the gas inlet unit can have two, or a plurality of, in particular three, gas distribution chambers, which are arranged one behind another in the axial direction of the base body, as is fundamentally known in the art from DE 10 2008 055 582 A1. The gas distribution chambers, which differ from one another, are in each case separated from one another by means of separator plates. A gas supply line can open into each gas distribution chamber. The gas supply line runs through a holder, in particular made of stainless steel, and in particular is designed in the form of a space, which extends between an inner wall of an outer pipe and an outer wall of an inner pipe. An innermost pipe can form a coolant supply line or discharge line. The gas supply lines thus have an annular volume in cross-section. The separator plates can in each case have a central opening, through which the pipes can protrude. In a development of the invention, the gas inlet unit consists of a plurality of assembled parts, wherein one part is the base body, which forms the outer wall with the cooling channels and the gas outlet openings. Furthermore the base body can form one or more annular lands, which project radially inward from the inner wall of the essentially tubular base body. These annular lands serve for the attachment of separator plates. The annular lands define an annular opening, wherein the openings of the various annular lands have different diameters. At a free end of the basic body there is located a first annular land, which defines the largest opening. The annular lands located further away from the latter in each case define openings, whose diameters progressively decrease. The separator plates can thus be connected to the annular lands in sequence, wherein the separator plate with the smallest diameter is first brought through the opening with the largest diameter, so as to be connected to the innermost of the annular lands. This can be achieved by welding in the case of metal separator plates or a base body consisting of metal. It can also be achieved by the use of a suitable adhesive. However, form-fit connecting means can also be provided. Furthermore, the edge of the separator plate and the annular land can also be fused together. In sequence, separator plates with increasing diameters are brought through the opening with the largest diameter, and in each case are connected to one of the annular lands, until the last separator plate is connected to the annular land with the largest diameter. Here too, the edges of the separator plates can be connected to the edges of the annular lands in the manner described above. In particular, provision can be made for the annular lands to form a step, against which abuts a mating step of the edge of the separator plate. By way of these two surfaces, extending in one plane, the separator plate and the annular land can be connected to one another. It is advantageous if the separator plate has central openings. In particular, provision is made for the separator plate with the smallest outer diameter to have the opening with the largest inner diameter, and for the separator plate with the largest outer diameter to have the central opening with the smallest diameter. In a development of the invention, provision is made for a pressure barrier to be arranged in each of the at least one gas distribution chambers. The pressure barrier can be a metal body, in particular a stainless-steel body, a ceramic body, or a quartz body. In particular, the pressure barrier has an annular outline, and has a cylindrical shape. The pressure barrier thus forms a section of a pipe with two edges facing away from one another. A multiplicity of passage openings extend through the wall of the pressure barrier, which extends on a cylindrical outer surface, through which passage openings a gas introduced into a central section of the gas distribution chamber can flow into a radially outer section of the gas distribution chamber, from where it flows through the gas outlet openings into a process chamber of a CVD reactor. The pressure barriers can be installed during the assembly of the separator plates. For this purpose, a separator plate and a pressure barrier are alternately inserted into the opening of the base body. The separator plates can form recesses extending along an arc line on their broad faces. These recesses form locating openings, into which projections of the edges of the pressure barriers can enter, such that the pressure barriers can be mounted in a centered position. The edges of the pressure barrier facing away from one another thus preferably form projections, which engage in associated recesses of the respective adjacent separator plate. In a development of the invention, provision is made for the cooling channels to extend in a straight line between the two end faces of the base body, facing away from one another. Here they can run parallel to the figure axis of the cylindrical base body. However, it is also possible for the coolants to run at an angle to the latter. In this case, they run in each case along a helical path, wherein the helical paths run parallel to one another. However, the cooling channels can also run in a meandering manner around the gas outlet openings, such that one or a plurality of gas outlet openings are arranged in one turn of a cooling channel. Such a meandering route of a cooling channel can be produced by means of the preferred method of laser etching. The method is described in DE 102018130140 A1. The disclosure content of this document is incorporated in full into this application. The invention further relates to a gas inlet device, in which the gas inlet unit, as previously described, is attached to a holder made of steel. The base body can be welded to the holder. In the holder, the supply lines extend in the form of nested pipes, wherein a supply line, in particular a supply line or a discharge line of a coolant, can also run in the wall of the body of the holder. In particular, it is a coolant discharge line, which is connected to the annular coolant chamber. The pipes can be welded to the separator plates. The parts forming the gas inlet unit, in particular metal parts, namely, the base body, the separator plates, and the pressure barriers, can be produced by means of 3D-printing. The 3D-printing method is used in particular in the manufacture of the base body, such that cooling channels that do not run in a straight line can also be produced in a stainless-steel body. The invention further relates to a CVD reactor, as is described in DE 10 2008 055 582 A1 or in DE 100 43 600 B4. Such a CVD reactor has a gas-tight stainless-steel housing, to the cover of which the holder is attached. The holder also carries a process chamber ceiling, which bounds a process chamber at the top. The process chamber is bounded at the bottom by a susceptor made of graphite or similar, which can have a central cavity, into which the lowest section of the gas inlet unit can be lowered, such that the gas outlet openings of the lowest gas distribution chamber open directly above the upper face of the susceptor. The susceptor surrounding the gas inlet unit has a multiplicity of storage locations for substrates. The substrates can be arranged on substrate carriers, which are supported on a gas cushion, and are driven in rotation by the gas cushion. A heating device can be provided below the susceptor so as to heat the susceptor. For the supply of the gas inlet unit with process gases, for example with organometallic compounds of the group III elements and hydrides of the group V elements, as well as hydrogen as a carrier gas, a gas mixing system can be provided, which is connected to gas sources. In order to deposit a layer on a substrate with the CVD reactor according to the invention, the process chamber is heated to a process temperature, and the process gases are fed into the process chamber through the gas inlet unit, wherein different process gases are fed into the process chamber through the gas distribution chambers that are separated from one another. For example, the hydrides are fed through the two axially-outermost gas distribution chambers, and the organometallic compound is fed through the central gas distribution chamber.

BRIEF DESCRIPTION OF THE DRAWINGS

In what follows, an example embodiment of the invention is explained with the aid of the accompanying drawings. Here:

FIG. 2 shows, in an enlarged manner, the detail II of the cross-section of the gas inlet unit along the line I-I in FIG. 4, FIG. 8 shows an illustration according to FIG. 6 of a further example embodiment, and FIG. 9 shows an illustration according to FIG. 6 of a further example embodiment.

DETAILED DESCRIPTION

Figure 7:
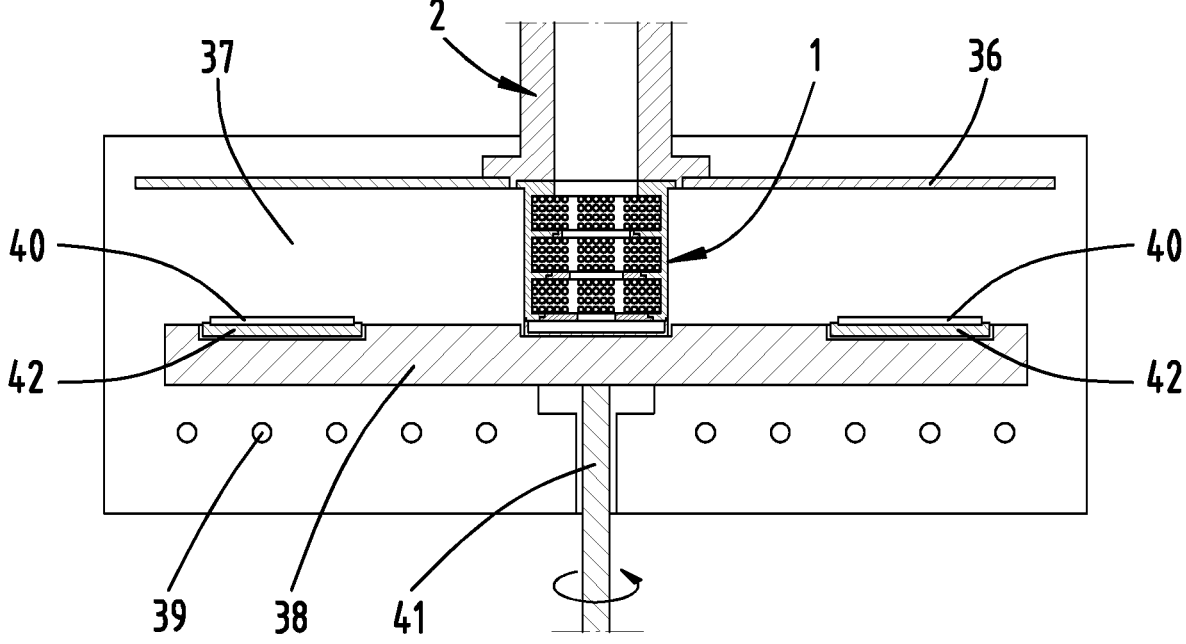
FIG. 7 shows schematically the structure of a CVD reactor in the form of a longitudinal cross-section.

The invention relates to a CVD reactor as is illustrated, for example, in FIG. 7, or described in DE 10 2015 101 462 A1.

The invention relates to a development of the gas inlet unit there illustrated, which in particular has three gas inlet zones arranged one above another.

Figure 1:
FIG. 1 shows the lower section of a holder 2, which is, or can be, attached to a cover of a housing of a CVD reactor, and which carries a gas inlet unit at its lower end, in a cross-sectional view along the line I-I in FIG. 4.
Figure 3:
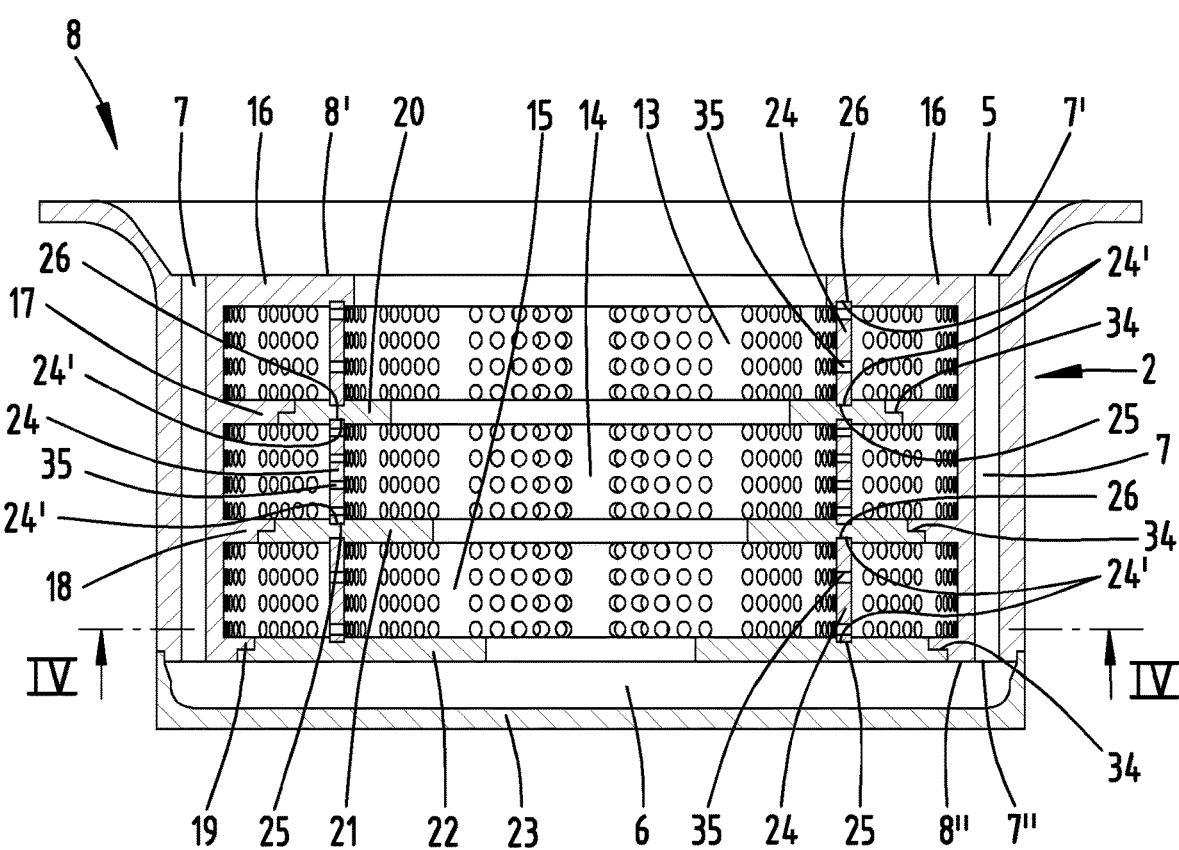
FIG. 3 shows the cross-section through a base body 8 of a gas inlet unit 2 along the line III-III in FIG. 4, wherein the cross-sectional line passes through cooling channels 7.

FIG. 1 shows the lower section of a holder 2, which is attached to the cover of a CVD reactor housing outlined in FIG. 7. Inside the stainless-steel holder 2 are located four nested pipes. An innermost pipe 30 forms a coolant line, for example a coolant supply line 3, through which a coolant can be fed into a coolant chamber 6 of a gas inlet unit 1 attached to the lower region of the holder 2. Around the central pipe 30 extends another pipe 29, which surrounds the pipe 30 with a uniform spacing, such that the space between the outer surface of the pipe 30 and the inner surface of the pipe 29 forms a gas supply line 33. A pipe 28 extends around the pipe 29 with a uniform spacing, such that a further gas supply line 32 is formed between the inner wall of the pipe 28 and the outer wall of the pipe 29. A further pipe 27 extends around the pipe 28, such that a further gas supply line 31 is formed between the inner wall of the pipe 27 and the outer wall of the pipe 28. Inside the holder 2 extends a further coolant line, for example a coolant discharge line 4, which is connected to a coolant chamber 5, which surrounds the pipe 27 in an annular manner.

FIG. 2 shows the gas inlet unit 1 and the above-described gas supply lines 31 to 33, together with coolant line 3.

The gas inlet unit 1 consists of stainless steel and is multi-part, at least in the course of assembly. Part of the gas inlet unit 1 is formed by a base body 8, which essentially takes the form of a cylindrical hollow body. The base body 8 has an outer wall 10 with a material thickness of between 2 and 10 mm. Uniformly distributed gas outlet openings 12 extend in the outer wall 10 over the entire circumferential surface of the base body 8, which forms a gas outlet surface 11. The gas outlet openings 12 are bores between the gas outlet surface 11 and an inner surface 11' of the outer wall 10, which forms a gas distribution wall.

The reference numeral 7 designates a cooling channel 7 running transversely to the direction of extent of the gas outlet openings 12, which cooling channel extends in the axial direction in the outer wall 10.

A cooling channel 7 according to the invention has, in particular, a uniform and thus constant cross-sectional area over its entire length. The equivalent circle diameter of a cooling channel 7 can be between 0.5 mm and 7 mm. The cross-sectional area of a cooling channel 7 can have a circular shape, the shape of an oval, or also a polygonal shape. The invention preferably comprises such gas inlet units, in which at least ten, preferably at least fifteen, or at least twenty cooling channels 7 are arranged in a uniform angular distribution in an outer wall 10, wherein a multiplicity of gas outlet openings 12 are arranged between two adjacent cooling channels 7, which gas outlet openings preferably also have a cross-sectional area that is uniform over their entire length of extent.

Annular lands 16, 19 are located on the two end faces of the base body 8 that are facing away from one another. The end faces of the base body 8 facing away from one another form end surfaces 8', 8" extending in a plane. The openings 7', 7" of the cooling channel 7 extend into the end surfaces 8', 8". The cooling channel 7 connects a lower coolant chamber 6 with an upper coolant chamber 5, wherein the upper coolant chamber 5 extends in an annular manner around the pipe 27. A sub-section of the wall of the upper coolant chamber 5 is formed by the holder 2, and another sub-section of the cooling wall of the coolant chamber 5 is formed by a connecting section 9 of the base body 8.

Furthermore, a section of the coolant chamber 5 is formed by the annular plate 16, and by a section of the pipe 27.

Further annular lands 17, 18, 19 project from the inner surface 11′ into a cavity of the base body 8, wherein the annular lands 17, 18, 19 have different radial lengths, and in particular have openings with different diameters. An innermost annular land 17 surrounds an opening with the smallest diameter, and an outermost annular land 19 surrounds an opening with the largest diameter. The central annular land 18 surrounds an opening with a diameter that is larger than the opening surrounded by the annular land 17, and is smaller than the diameter of the opening surrounded by the annular land 19.

The openings of the annular lands 17, 18, 19 are in each case closed by separator plates 20, 21, 22, which are connected to the annular lands 17, 18, 19, for which purpose the annular lands 17, 18, 19 form steps 34 and the separator plates 20, 21, 22 form corresponding mating steps.

In each of the three gas distribution chambers 13, 14, 15, arranged one above another, there are located tubular pressure barriers 24 with passage openings 35. The edges 24′ of the pressure barrier 24 are inserted into recesses 25, 26 of the annular plate 16 and the separator plates 20, 21, 22. The recesses 25, 26 run on a circular arc line about the figure axis of the gas inlet unit 1.

The separator plates 20, 21, 22 have central openings, through which the pipes 28, 29, 30 protrude. The openings of the separator plates 20, 21, 22 have diameters that differ from one another.

A closure element 23 is attached to the lower face of the base body 8, which closure element bounds the coolant chamber 6. The closure element 23, the separator plate 20, 21, 22, and the pressure barriers 24, can consist of stainless steel, and can have an annular projection on the edge, extending in the axial direction, which engages in an annular cavity of the base body 8. The stainless-steel parts can be welded together.

Figure 4:
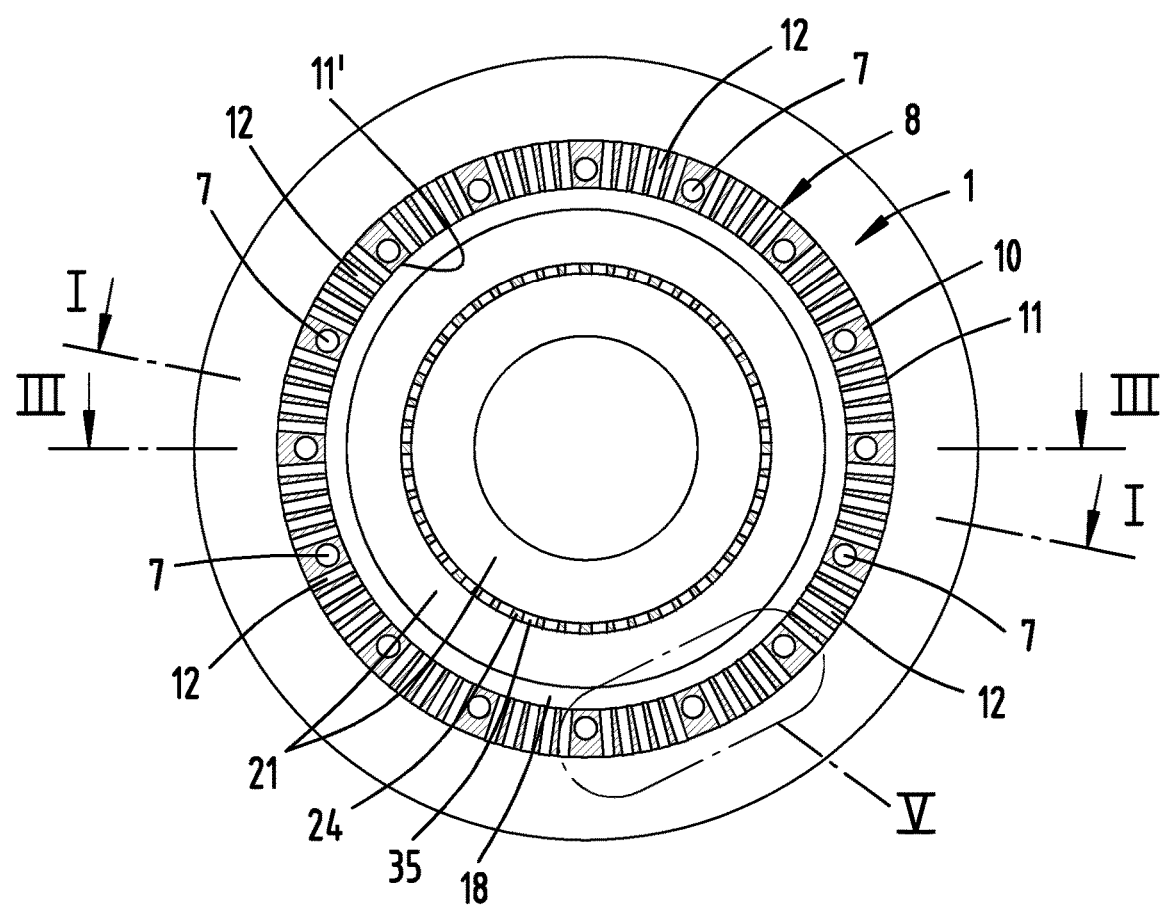
FIG. 4 shows the cross-section along the line IV-IV in FIG. 3.
Figure 5:
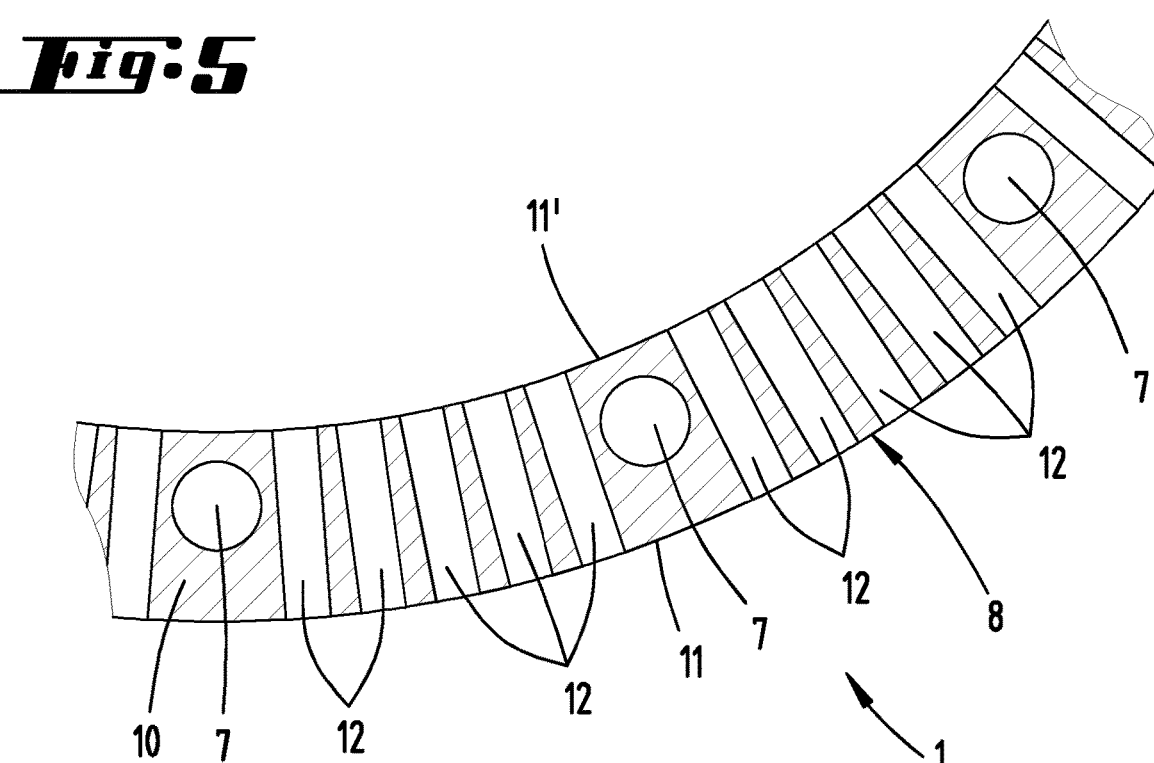
FIG. 5 shows, in an enlarged manner, the detail V in FIG. 4.

FIG. 4 and FIG. 5 show that a multiplicity of cooling channels 7 are evenly spaced around the circumference of the base body 8. The cooling channels 7 extend as linear bores through the outer wall 10 of the base body 8. A plurality of gas outlet openings 12, which are also designed as bores, run between two immediately adjacent cooling channels 7. The diameter of the cooling channels 7 can also be in the range between 1 and 8 mm. In the example embodiment, twenty cooling channels 7 are provided, extending parallel to one another.

A 3D-metal printing method can be used to manufacture the base body 8.

Selective laser-induced etching (SLE) can be used as a method for the manufacture of a quartz base body. In this method, a local material transformation of an initially homogeneous quartz body, which can take the form of a cylindrical tubular body, is carried out in a first process step. For this purpose, an ultra-short pulsed laser beam is focussed on a focal point in the micron range, wherein by a three-dimensional movement of the laser beam relative to the quartz base body the focal point is guided in a writing manner through the volume of the quartz body. The focussed laser beam is used to expose volumetric regions that are distant from the surface. A material transformation of the quartz material takes place at the focal point of the laser beam by way of a multi-photon process. The material thus transformed can be removed in a second process step by means of an etching fluid. This can be KOH.

The methods can be used to produce both the cooling channels 7 and the gas outlet openings 12. A gas inlet unit produced by this method can have cooling channels 7 or gas outlet openings that are smaller than 2 mm, smaller than 1 mm, smaller than 0.5 mm, and smaller than 0.2 mm. The diameter of the cooling channels 7 preferably lies in a range between 0.1 mm and 2 mm or 3 mm.

With these methods it is possible to manufacture not only linear, but also curvilinear, and, in particular, helical cooling channels 7, as can be implemented on a gas inlet unit 1 according to the invention.

Figure 6:
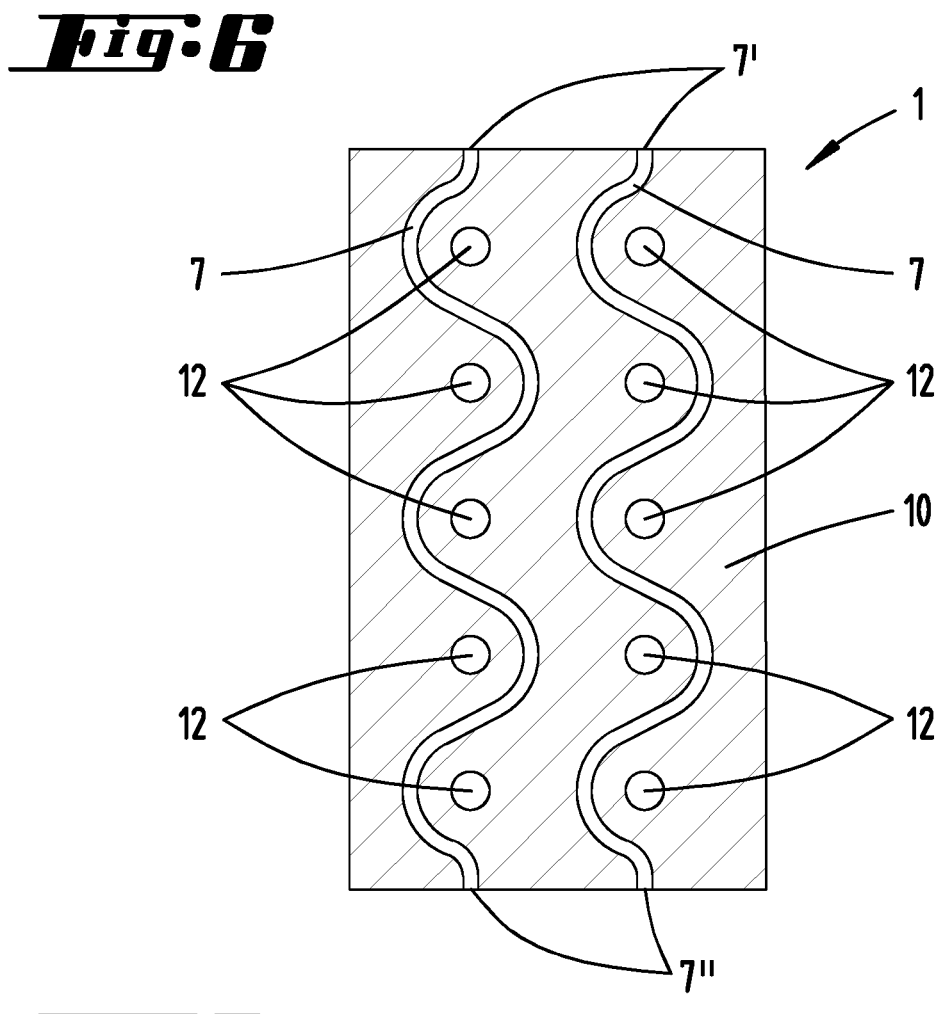
FIG. 6 shows an illustration of a variant of a route of the cooling channels 7.

FIG. 6 shows an example of a serpentine route of a cooling channel 7. The cooling channel 7 meanders in the outer wall 10, wherein one or a plurality of gas outlet openings 12 can be arranged within the windings of the cooling channel 7.

FIG. 7 shows schematically a CVD reactor with a housing, consisting, for example, of stainless steel, into which the holder 2 with its gas inlet unit 1 protrudes. The holder 2 carries a process chamber ceiling 36, which bounds a process chamber 37 at the top. The process chamber 37 is bounded at the bottom by a susceptor 38, which extends parallel to the process chamber ceiling 36, and has a multiplicity of pockets in a circular arrangement about an axis of rotation, in each of which pockets is inserted a substrate carrier 42, which carries at least one substrate 40. The substrate carrier 42 rests on a gas cushion, which also causes the substrate carrier 42 to rotate. The susceptor 38 can be driven in rotation about its figure axis by means of a shaft 41. The substrate carrier 42 thereby rotates around the stationary gas inlet unit 1. The susceptor 38 is heated with a heating device 39.

The holder 2 and the base body 8, or the gas inlet unit 1, can be connected to one another by a welded joint.

FIG. 8 shows a further variant of the invention, in which a cooling channel 7 splits into two cooling channels running parallel to one another, wherein the two cooling channels running parallel to one another reunite at another point. One or a plurality of gas outlet openings can be located within the region surrounded by the branched cooling channels.

In the example embodiment illustrated in FIG. 9, the cooling channels 7 also branch apart, in order to be reunited later. The branched cooling channels 7 surround a gas outlet opening 12 in an annular shape. In the example embodiments illustrated in FIGS. 8 and 9, the cooling channels 7 have an essentially uniform cross-section over their entire length.

The above statements serve to explain the inventions covered by the application as a whole, which also independently advance the prior art at least by means of the following combinations of features in each case, wherein it is possible for two, a plurality, or all, of these combinations of features also to be combined, namely:

A gas inlet unit, which is characterized in that the cooling means has a multiplicity of cooling channels 7 extending separately side-by-side in the outer wall 10 between two coolant chambers 5, 6.

A gas inlet unit, which is characterized in that the outer wall 10 consists of metal, in particular stainless steel, ceramic, or quartz, the coolant chambers 5, 6 are associated with the end faces of the base body 8 facing away from one another, which form a coolant distribution chamber and a coolant collection chamber, which are connected to one another in terms of flow by at least ten cooling channels 7 connected in parallel, and/or in that the cooling channels 7 have no branches, have uninterrupted walls, and are not connected to one another, and/or in that the cooling channels 7 are guided around one or a plurality of gas outlet openings 12, with the formation of branches, and/or in each case have a constant cross-sectional area over their entire length, and/or in that the cooling channels 7 have a circular, oval, or polygonal, cross-sectional area, in all cases along their entire surface.

A gas inlet unit, which is characterized in that the cooling channels 7 extend in a linear, curved, or serpentine manner between the gas outlet openings 12 formed by radial bores in the outer wall 10, wherein openings 7', 7" of the cooling channels 7 extend into parallel end surfaces 8', 8" of the base body 8.

A gas inlet unit, which is characterized in that a first coolant chamber 5 is associated with a first end surface 8' and forms an annular volume, and in that a second coolant chamber 6 is associated with the second end surface 8", and/or in that the first coolant chamber 5 is separated from the at least one gas distribution chamber 13 by an annular plate 16, and the second coolant chamber 6 is separated from the at least one gas distribution chamber 15 by a separator plate 22, and/or in that the coolant supply line 3 opens into the first coolant chamber 5, and/or in that the coolant supply line 3 is formed by a pipe 30, which runs coaxially with the axis of the cylindrical body 8, and/or in that the second coolant chamber 6 is closed by a closure element 23, which forms a wall, which runs parallel to the separator plate 22.

A gas inlet unit, which is characterized in that two or a plurality of gas distribution chambers 13, 14, 15 are arranged one behind another in the axial direction of the basic body 8, and are separated from one another by means of separator plates 20, 21, wherein a gas supply line 31, 32, opens into each of the plurality of gas distribution chambers 13, 14, 15, and/or in that gas supply lines 31, 32, 33 opening into the gas distribution chambers 13, 14, 15 are formed by volumes that are annular in cross-section, which extend between the surfaces of coaxial pipes 27, 28, 29, 30 that are facing one another, and/or in that the innermost of a plurality of pipes 27, 28, 29, 30 arranged coaxially with one another forms the coolant supply line 3, and/or in that the separator plates 20, 21, 22 have a central opening through which the pipes 28, 29, 30 protrude.

A gas inlet unit, which is characterized in that separator plates 20, 21, 22, which separate differing gas distribution chambers 13, 14, 15, and/or a coolant chamber from a gas distribution chamber 15, are connected to annular lands 17, 18, 19, which are formed of the same material as the base body 8, and/or in that annular lands 17, 18, 19, which are formed of the same material as the base body 8, for attachment to separator plates 20, 21, 22, surround openings, which have diameters that differ from one another, wherein the opening of the annular land 19 immediately adjacent to an end surface 8" of the base body has the largest diameter, and the diameters of the openings of the annular lands 18, 17 lying axially remote therefrom become progressively smaller, and/or in that the radially inward edges of the annular lands 17, 18, 19 form steps 34, to which stepped edge sections of the separator plates 20, 21, 22 are attached, and/or in that the separator plates 20, 21, 22 consist of quartz, and/or in that the separator plates 20, 21, 22 have central openings, wherein the separator plate 22 with the largest outer diameter forms the central opening with the smallest diameter, and the separator plate 20 with the smallest outer diameter forms the central opening with the largest diameter, and/or in that three gas distribution chambers 13, 14, 15 are arranged one behind another in the axial direction, and/or in that the separator plates 20, 21, 22 consist of metal, in particular stainless steel, and are welded to the annular lands 17, 18, 19.

A gas inlet unit, which is characterized in that annular pressure barriers 24 are arranged in the one or plurality of gas distribution chambers 13, 14, 15, wherein the pressure barriers 24 are arranged around a central gas supply line 31, 32, 33 and have passage openings 35, for the gas fed into the gas distribution chambers 13, 14, 15 to pass through into an annular chamber surrounding the pressure barrier 24, which adjoins an inner surface 11' of the outer wall 10, and/or in that the pressure barriers 24 are formed by tubular elements which have edges 24' facing away from one another, which, at least in regions, engage in recesses 25, 26 of a boundary wall, which bounds the gas distribution chambers 13, 14, 15 in the axial direction, and/or in that the pressure barriers 24 consist of quartz, and/or in that the pressure barriers 24 consist of metal, in particular stainless steel, and are welded to the separator plates 20, 21, 22, or to the annular plate 16.

A gas inlet unit, which is characterized in that at least the linear, non-linear, curved, or serpentine, cooling channels 7, arranged in a uniform circumferential distribution in the outer wall 10, are produced by selective laser etching.

A gas inlet device, which is characterized in that the holder 2 holds a gas inlet unit 1 according to any one of the preceding claims, and/or in that the holder 2 is welded to the gas inlet unit 1.

All disclosed features are essential to the invention (individually, but also in combination with one another). The disclosure of the application hereby also includes the full disclosure content of the associated/attached priority documents (copy of the previous application), also for the purpose of including features of these documents in the claims of the present application. The dependent claims, even without the features of a claim referred to, characterise with their features independent inventive developments of the prior art, in particular in order to make divisional applications on the basis of these claims. The invention specified in each claim can additionally have one or a plurality of the features specified in the above description, in particular those provided with reference numerals, and/or in the list of reference numerals. The invention also relates to forms of design, in which individual features cited in the above description are not realized, in particular to the extent that they can recognizably be dispensed with for the respective intended use, or can be replaced by other means having the same technical effect.

LIST OF REFERENCE SYMBOLS

1 Gas inlet unit
2 Holder
3 Coolant supply line
4 Coolant discharge line
5 Coolant chamber
6 Coolant chamber
7 Cooling channel
7' Opening
7" Opening
8 Base body
8' (Cylindrical) end surface
8" End surface
9 Connecting section
10 Outer wall, gas distribution wall
11 Gas outlet surface
11' Inner surface
12 Gas outlet opening
13 Gas distribution chamber
14 Gas distribution chamber
15 Gas distribution chamber 16 Annular plate
17 Annular land
18 Annular land
19 Annular land
20 Separator plate
21 Separator plate
22 Separator plate
23 Closure element
24 Pressure barrier
24' Edge
25 Recess
26 Recess
27 Pipe
28 Pipe
29 Pipe
30 Pipe
31 Gas supply line
32 Gas supply line
33 Gas supply line
34 Step
35 Passage opening
36 Process chamber ceiling
37 Process chamber
38 Susceptor
39 Heating device
40 Substrate
41 Shaft
42 Substrate carrier

What is claimed is:

1. A gas inlet unit (1) for a chemical vapor deposition (CVD) reactor, comprising:

at least one gas distribution chamber (13, 14, 15);

a cylindrical outer wall (10) that surrounds the at least one gas distribution chamber (13, 14, 15);

a cylindrical base body (8) that, with the cylindrical outer wall (10) forms a gas outlet surface (11), into which open a plurality of gas outlet openings (12) originating in the at least one gas distribution chamber (13, 14, 15);

at least one gas supply line (31, 32, 33) fluidly coupled to the at least one gas distribution chamber (13, 14, 15);

a first coolant chamber (5) disposed adjacent to a top end of the cylindrical base body (8), wherein the first coolant chamber (5) comprises an annular volume;

a second coolant chamber (6) disposed adjacent to a bottom end of the cylindrical base body (8);

a first coolant line and second coolant line (3, 4), wherein the first coolant line (3) is an innermost pipe (30) of a plurality of nested pipes which form the at least one gas supply line (31, 32, 33), and wherein the first coolant chamber (5) surrounds the plurality of nested pipes in an annular manner; and a cooling device that is fluidly connected to the first and second coolant lines (3, 4) and the second coolant chamber (6) so as to convey a coolant through the cooling device, wherein the cooling device has a plurality of cooling channels (7) that are arranged in a uniform angular distribution in the cylindrical outer wall (10) between the second coolant chamber (6) and the first coolant chamber (5), the plurality of cooling channels (7) being spaced apart from one another, wherein each of the cooling channels (7) receives the coolant from the second coolant chamber (6), transports the coolant away from the second coolant chamber (6) and towards the first coolant chamber (5), and delivers the coolant into the first coolant chamber (5), wherein each of the cooling channels (7) comprises a first opening (7') to the first coolant chamber (5) and a second opening (7") to the second coolant chamber (6), and wherein the first and second openings face away from another and are each located in respective end surfaces (8', 8") of the cylindrical base body (8).

2. The gas inlet unit (1) of claim 1, wherein the cylindrical outer wall (10) consists of metal, and wherein the plurality of cooling channels (7) comprises at least ten cooling channels (7) arranged parallel to one another.

3. The gas inlet unit of claim 1, wherein one of: the cooling channels (7) do not include any branching channels, the cooling channels (7) comprise branching channels that are disposed adjacent to one or more of the gas outlet openings (12), or the cooling channels (7) each has a constant circular, oval or polygonal cross-sectional area over its entire length.

4. The gas inlet unit of claim 1, wherein the first and second coolant chambers (5, 6) are formed in part by end faces of the cylindrical base body (8) that face away from one another.

5. The gas inlet unit of claim 1, wherein the cooling channels (7) each run in a straight, curved, or serpentine line between the gas outlet openings (12) formed by radial bores in the cylindrical outer wall (10).

6. The gas inlet unit of claim 5, wherein the second coolant chamber (6) is separated from the at least one gas distribution chamber (15) by a separator plate (22).

7. The gas inlet unit of claim 6, wherein the first coolant line (3) opens into the second coolant chamber (6), wherein the first coolant line (3) is formed by a pipe (30) that runs coaxially with an axis of the cylindrical base body (8), and wherein the second coolant chamber (6) is formed in part by a closure element (23) having a wall that runs parallel to the separator plate (22).

8. The gas inlet unit of claim 6, wherein the first coolant chamber (5) is separated from the at least one gas distribution chamber (13) by an annular plate (16).

9. The gas inlet unit of claim 8, wherein the separator plates (20, 21, 22) are connected to annular lands (17, 18, 19), wherein the annular lands (17, 18, 19) comprise respective openings for attachment to a corresponding one of the separator plates (20, 21, 22), wherein the openings have respective diameters that differ from one another, wherein the respective diameters of the annular lands (19) become progressively smaller away from the first end surface (8') of the cylindrical base body (8), and wherein respective radially inward edges of the annular lands (17, 18, 19) form steps (34), to which geometrically complementary stepped edges of the separator plates (20, 21, 22) are attached.

10. The gas inlet unit (1) of claim 9, wherein the annular lands (17, 18, 19) and the cylindrical base body (8) both comprise a first material.

11. The gas inlet unit (1) of claim 9, wherein at least one of:

the separator plates (20, 21, 22) consist of quartz or metal, or the separator plates (20, 21, 22) are welded to the annular lands (17, 18, 19).

12. The gas inlet unit of claim 1, wherein the at least one gas distribution chamber (13, 14, 15) comprises a plurality of gas distribution chambers (13, 14, 15) arranged one on top of another in an axial direction of the cylindrical base body (8), and are separated from one another by respective separator plates (20, 21, 22), and wherein the at least one gas supply line (31, 32, 33) is fluidly coupled to each of the plurality of gas distribution chambers (13, 14, 15).

13. The gas inlet unit of claim 12, wherein the at least one gas supply line comprise a plurality of gas supply lines (31, 32, 33) that are formed by respective volumes between mutually facing surfaces of a plurality of pipes (27, 28, 29, 30) that are arranged coaxially with respect to one another, and wherein the separator plates (20, 21, 22) each have a central opening through which the plurality of pipes (28, 29, 30) protrude.

14. The gas inlet unit of claim 1, wherein the at least one gas distribution chamber (13, 14, 15) comprises a plurality of gas distribution chambers (13, 14, 15), the gas inlet unit further comprising pressure barriers (24) arranged in at least one of the gas distribution chambers (13, 14, 15), wherein the pressure barriers (24) have an annular shape, wherein the pressure barriers (24) are arranged around the at least one gas supply line (31, 32, 33), and have passage openings (35) for feeding gas into the plurality of gas distribution chambers (13, 14, 15), wherein the pressure barriers (24) are formed by tubular elements that have respective edges (24') facing away from one another, wherein the respective edges (24') engage in respective recesses (25, 26) of separator plates (20, 21, 22), and wherein the separator plates (20, 21, 22) separate the plurality of gas distribution chambers (13, 14, 15) in an axial direction.

15. The gas inlet unit (1) of claim 14, wherein the pressure barriers (24) consist of metal, and wherein the pressure barriers (24) are welded to the separator plates (20, 21, 22) or are welded to an annular plate (16) which forms part of the first coolant chamber (5).

16. A gas inlet device for feeding one or more process gases into a process chamber (37) of a chemical vapor deposition (CVD) reactor, the gas inlet device comprising:

the gas inlet unit (1) of claim 1;

a housing of the CVD reactor; and a holder (2) for holding the gas inlet unit (1) of claim 1, wherein the holder (2) is attached to the housing of the CVD reactor, and wherein the at least one gas supply line (31, 32, 33), the first coolant line (3), and the second coolant line (4) pass through the housing of the CVD reactor.

17. A chemical vapor deposition (CVD) reactor, comprising:

the gas inlet unit (1) of claim 1;

a process chamber (37);

a cover plate forming a ceiling (36) of the process chamber (37); and a susceptor (38) forming a floor of the process chamber (37), wherein the process chamber (37) surrounds the gas inlet unit (1), and wherein the gas inlet unit (1) extends between the cover plate and the susceptor (38).

* * * * *